(12) United States Patent
Lehman

(10) Patent No.: US 7,225,381 B1
(45) Date of Patent: May 29, 2007

(54) ERROR DETECTION AND CORRECTION METHOD

(76) Inventor: Thomas F. Lehman, 2903 SW. Scherer Rd., Lees Summit, MO (US) 64081

( * ) Notice: Subject to any disclaimer, the term of this patent is extended or adjusted under 35 U.S.C. 154(b) by 69 days.

(21) Appl. No.: 11/145,047

(22) Filed: Jun. 2, 2005

(51) Int. Cl.
*G06F 11/00* (2006.01)
*G06F 11/30* (2006.01)

(52) U.S. Cl. .................................................. 714/746
(58) Field of Classification Search ................. None
See application file for complete search history.

(56) References Cited

U.S. PATENT DOCUMENTS

| | | | |
|---|---|---|---|
| 4,597,083 A | 6/1986 | Stenerson | |
| 4,719,642 A | 1/1988 | Lucas | |
| 4,845,713 A | 7/1989 | Zook | |
| 5,497,383 A | 3/1996 | Thome et al. | |
| 5,600,659 A | 2/1997 | Chen | |
| 5,880,982 A | 3/1999 | Evans | |
| 6,119,262 A | 9/2000 | Chang et al. | |
| 6,192,497 B1 | 2/2001 | Yang et al. | |
| 6,219,815 B1 | 4/2001 | DesJardins et al. | |
| 6,263,471 B1 | 7/2001 | Huang | |
| 6,343,103 B1 | 1/2002 | Lou et al. | |
| 6,370,671 B1 | 4/2002 | Pan et al. | |
| 6,374,383 B1 | 4/2002 | Weng | |
| 6,385,751 B1 | 5/2002 | Wolf | |
| 6,574,774 B1 | 6/2003 | Vasiliev | |
| 6,594,796 B1 | 7/2003 | Chiang | |
| 6,662,336 B1 | 12/2003 | Zook | |
| 6,732,306 B2 | 5/2004 | Dover et al. | |
| 6,735,737 B2 | 5/2004 | Sankaran et al. | |
| 6,975,689 B1 * | 12/2005 | McDonald et al. | 375/316 |
| 7,034,964 B2 * | 4/2006 | Suzuki | 358/3.06 |
| 2003/0179733 A1 * | 9/2003 | Yano | 370/335 |

OTHER PUBLICATIONS

EE4253 Digital Communications—Secrets of the ISBM—An Error Detection Method—University of New Brunswick, Department of Electrical and Computer Engineering—Sep. 8, 1998.
Weighted Sum Codes for Error Detection and Their Comparison wih Existing Codes—A. J. McAuley—IEEE/ACM Transactions on Networking, vol. 2, No. 1, Feb. 1994.

* cited by examiner

*Primary Examiner*—Christine T. Tu
(74) *Attorney, Agent, or Firm*—Fellers, Snider, et al.; Daniel P. Dooley (57) ABSTRACT

A method for error detection and correction of a memory, preferably a flash memory that utilizes existing on-chip circuitry to implement the error correction and detection process is disclosed. The present invention is able to detect and correct single bit errors, while detecting multi-bit errors in data storage circuitry. The method is embodied in a software routine, which when actively operative, uses a multiply accumulate circuit (MAC) and on chip cache located on memory controller circuitry for error correction of errors incurred through the storage of data to a storage device.

40 Claims, 5 Drawing Sheets

ERROR DETECTION AND CORRECTION METHOD

FIELD OF THE INVENTION

The present invention relates to the field of testing semiconductor memories. More particularly, the present invention relates to a testing methodology for a storage device that uses multiply accumulate and compare techniques for memory error detection and correction to optimize testing and usage of a storage device.

BACKGROUND

Over the years, multitudes of memory testing methods have been developed. One such method makes use of a microprocessor coupled to a flash memory. The flash memory is programmed on a word-by-word basis. After each programming operation, the word just programmed is verified by the microprocessor. The verification operation is initiated by the microprocessor writing a program verify command into a command register of the flash memory. The program verify operation stages the flash memory for verification of the word last programmed. The flash memory applies an internally-generated margin voltage to the word. The microprocessor then performs a read cycle to output the word from the flash memory to the microprocessor. The microprocessor then compares the data word read from the flash memory to the data word that the microprocessor intended to program into the flash memory. A successful comparison between the programmed word and the time data means that the word was successfully programmed. If the data was not successfully programmed, then the program and verify steps are repeated with a limit of, for example, 25 attempts to program the word.

A secondary method of flash memory verification includes placing a flash memory system into a special programming mode. The special programming mode includes programming a plurality of words, by means of hashing, into the memory without the memory performing internal program verification. Hashing is a scheme for providing rapid access to data items which are distinguished by some key. A key is a value used to identify a record in a database, derived by applying some fixed function to the record, and is often simply one of the fields. The key may also be obtained by applying some function, e.g. a hash function, to one or more of the fields, and each data item to be stored is associated with a key.

The special programming mode allows the host processor to program a series of words by means of hashing and then store the words with their keys in the memory. Copies of the hash values are stored in the processor. A comparison is made between the memory stored hash values and the processor stored hash values to see whether the hash values are the same or different. The special programming mode is then exited and internal program verification by the memory is enabled. The comparison of the hash values allows the system to detect if the words were stored properly.

These and other methods of prior art memory verification tend to have the drawback that, while storage errors can be recognized (through the use of special circuits not typically found in processors), they can not be corrected. Furthermore, prior art memory correction systems and methods require separate error detection circuitry to be implemented, which can often be costly and take up valuable circuit area.

SUMMARY OF THE INVENTION

In accordance with preferred embodiments, an error detection and correction method that includes at least: receiving a series of bit data groupings, $D_n$; and generating a first value $S_0$, determined by a relationship $$\left(S_0 = \sum_{i=0}^{n-1} X_i * D_i\right),$$

wherein n preferably includes a total number of bit data groupings, $D_i$ preferably represents each bit data grouping of the bit data groupings $D_n$ is provided. Further included in a preferred embodiment, $X_i$ is preferably a weighted coefficient; and storing the bit data groupings, $D_n$, and the first value, $S_0$ are steps included in the preferred method, wherein the weighted coefficient, $X_i$, is preferably determined by a relationship $[(k*i)+A]$, in which "k" comprises a predetermined constant, "i" comprises an integer index value increasing from $0 \rightarrow n-1$, and in which "A" comprises a predetermined offset value. Also preferably included the preferred embodiment is a step of storing a copy of the first value, $S_0$, as a second value, $S_1$. It is recognized other methods may be used to guarantee a known good copy of $S_0$.

In an alternate preferred embodiment, a device that includes at least: a circuit configured to receive a series of bit data groupings, $D_n$; a multiply accumulator configured to generate a first value $S_0$; and a storage circuit configured to store the bit data groupings, $D_n$, and the first value, $S_0$ is provided.

In the alternate preferred embodiment, $S_0$ is preferably determined by a relationship $$\left(S_0 = \sum_{i=0}^{n-1} X_i * D_i\right),$$

wherein n comprises a total number of bit data groupings, $D_i$ comprises each bit data grouping of the bit data groupings $D_n$, and $X_i$ comprises a weighted coefficient preferably determined by the relationship $[(k*i)+A]$, wherein "k" comprises a predetermined constant, "i" comprises an integer index value increasing from $0 \rightarrow n-1$, and in which "A" comprises a predetermined offset value, and within the alternate preferred embodiment the storage circuit is preferably configured to store a copy of the first value, $S_0$, as a second value, $S_1$.

In accordance with an alternative preferred embodiment, an error detection and correction method includes at least the steps of: receiving a series of bit data groupings, $D_n$; generating a first value $S_0$; and storing the bit data groupings, $D_n$, and the first value, $S_0$. For the alternative preferred embodiment, $S_0$ is preferably determined by a relationship $$\left(S_0 = \sum_{i=0}^{n-1} C_i * Wt(B_i) + G(B_i)\right),$$

wherein "n" comprises a total number of bit data groupings, "i" comprises an integer index value increasing from $0 \rightarrow n-$ 1, Wt($B_i$) represents the weight of the data being acted upon, G($B_i$) represents the sum of the bit positions, and "$C_i$" comprises an offset value.

In further accordance with the alternative preferred embodiment, "$C_i$" is initially set to a predetermined offset value "A", and subsequently, $C_i$ is preferably increased through each iteration of $S_0$ calculation, by the generating function ($C_i=C_i+k*m$), where "m" is the total number of bits in the selected data grouping, where Wt($B_i$) is selected from values stored in a lookup table and corresponds to the bit weight of the received data stream, and G($B_i$) is determined by the relationship, $$G(B_i)k * \sum_{j=0}^{m-1} (b_{(i,j)} * j),$$

where "j" is a positive index value, "m" is the total number of bits in the selected data grouping, and $b_{(i,j)}$ corresponds to the bit value in the bit position, and "k" comprises a predetermined constant.

In accordance with an additional preferred embodiment, a device is provided that preferably includes at least: a circuit configured to receive a series of bit data groupings, $D_n$; a multiply accumulator configured to generate a first value $S_0$; and a storage circuit configured to store the bit data groupings, $D_n$, and the first value, $S_0$. $S_0$ is preferably determined by a relationship $$\left(S_0 = \sum_{i=0}^{n-1} C_i * Wt(B_i) + G(B_i)\right),$$

wherein "n" comprises a total number of bit data groupings, "i" comprises an integer index value increasing from 0→n−1, Wt($B_i$) represents the weight of the data being acted upon, G($B_i$) represents the sum of the bit positions, and "$C_i$" comprises an offset value.

For the additional preferred embodiment, "$C_i$" is initially set to a predetermined offset value "A", and subsequently, $C_i$ is preferably increased through each iteration of $S_0$ calculation, by a preferred generating function ($C_i=C_i+k*m$), where "m" is the total number of bits in the selected data grouping, where Wt($B_i$) is selected from values stored in a lookup table and corresponds to the bit weight of the received data stream. G($B_i$) is preferably determined by the relationship, $$G(B_i) = k * \sum_{j=0}^{m-1} (b_{(i,j)} * j),$$

where "j" is a positive index value, "m" is the total number of bits in the selected data grouping, and $b_{(i,j)}$ corresponds to the bit value in the bit position, and said weighted coefficient, $X_i$, is determined by [(k*i)+A], wherein "k" comprises a predetermined constant, "i" comprises an integer index value increasing from 0→n−1, and in which "A" comprises a predetermined offset value. Of course G($B_i$) may be stored in a look up table.

These and various other features and advantages which characterize the claimed invention will be apparent from reading the following detailed description and a review of the associated drawings.

BRIEF DESCRIPTION OF THE DRAWINGS

The present invention is illustrated by way of example and not limitation in the figures of the accompanying drawings, in which like references indicate similar elements and in which.

DETAILED DESCRIPTION

It will be readily understood that elements of the present invention, as generally described and illustrated in the Figures herein, could be arranged and designed in a wide variety of different configurations and may be presented in either software or hardware implementations.

Flash memory presents one environment in which the present invention has been found useful. Flash is normally written in blocks of data. A group of bytes are sent to the flash by the micro processor. The flash stores the group in one operation. For example, in a preferred embodiment, a block of data, say 512 one byte readings, collected from, for example, an analog to digital converter, is used by a processor to generate a sum of say 4 bytes. The sum is appended to the end of the block, twice, creating a total stored block size of 520 bytes. All 520 bytes are passed to the flash. The flash stores all 520 bytes to its permanent memory in one operation.

Later, the data is read from the flash by requesting the particular block and sequentially reading all 520 bytes from the data block in the flash. The processors regenerates a new sum over the 512 bytes read from the flash, and compares it with the stored sums to see if any bits have changed. Upon comparing the stored sums to the newly generated sum, and utilizing the techniques described below, a single bit data error in the block can be detected and corrected, and a two bit error in the data block can be detected.

The following more detailed description of the embodiments of the system of the present invention, as represented in FIG. 1 through FIG. 5, is not intended to limit the scope of the invention, as claimed, but is merely representative of certain embodiments of the system in accordance with the invention.

The embodiments of system in accordance with the invention will be best understood by reference to the drawings. Those of ordinary skill in the art will, of course, appreciate that various modifications may be made without departing from the essential characteristics of the invention.

Figure 1:
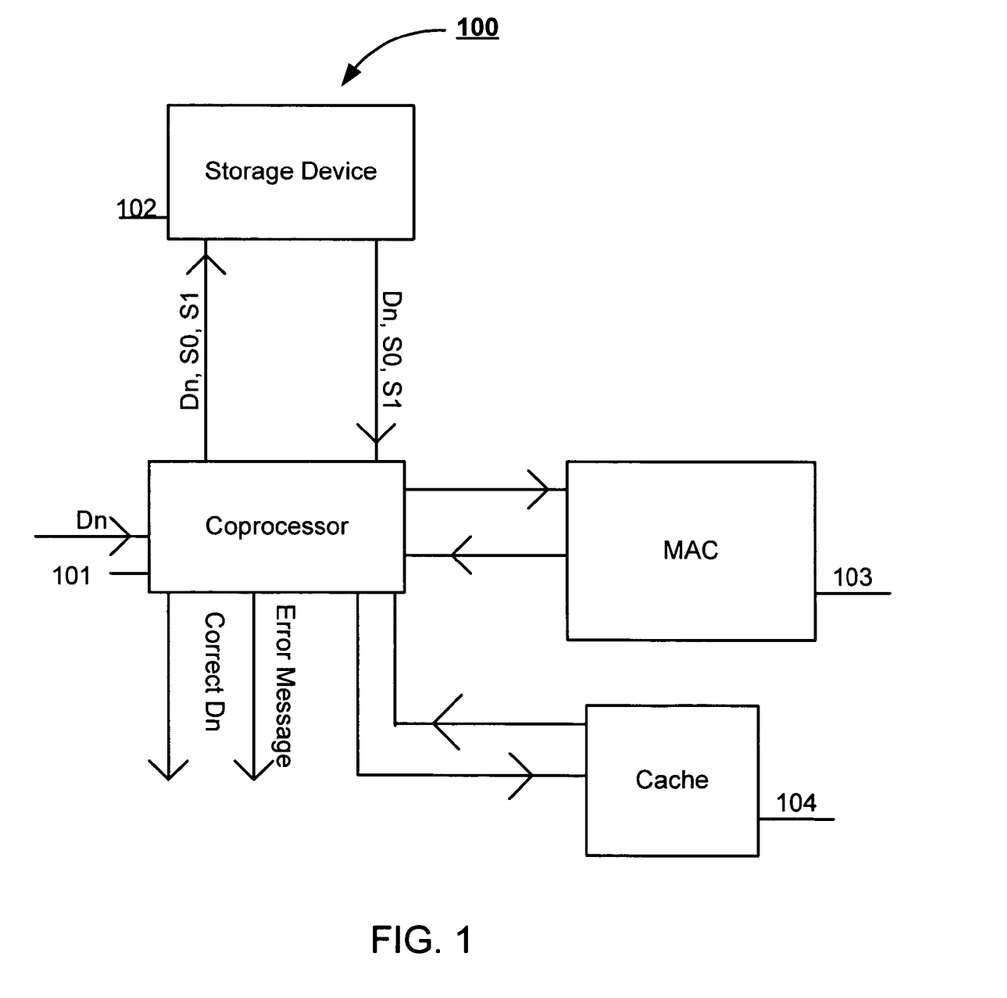
FIG. 1 is a schematic of the circuitry utilized in the present invention.

The method for error detection and correction of a data storage device (also referred to herein as flash memory) (102), shown by circuitry (100) of FIG. 1, includes receiving a series of bit data groupings, $D_n$, into a processing unit. One embodiment of the method is applicable to a flash memory.

This embodiment will be discussed below with regards to the method of error detection and correction described below.

Data bit groupings, $D_n$, are an array of data, typically grouped into bytes, however, the data groups can be of any size. For example, the data grouping may be a single bit, and the array of data is a block of data to which the bit is a member. The memory processor unit includes a multiply accumulator circuit (MAC) (103), a coprocessor (also referred to herein as processor) (101), and cache storage (104). In a preferred embodiment, the processor (101) and the MAC (103) cooperate to implement the methods described below.

Figure 2:
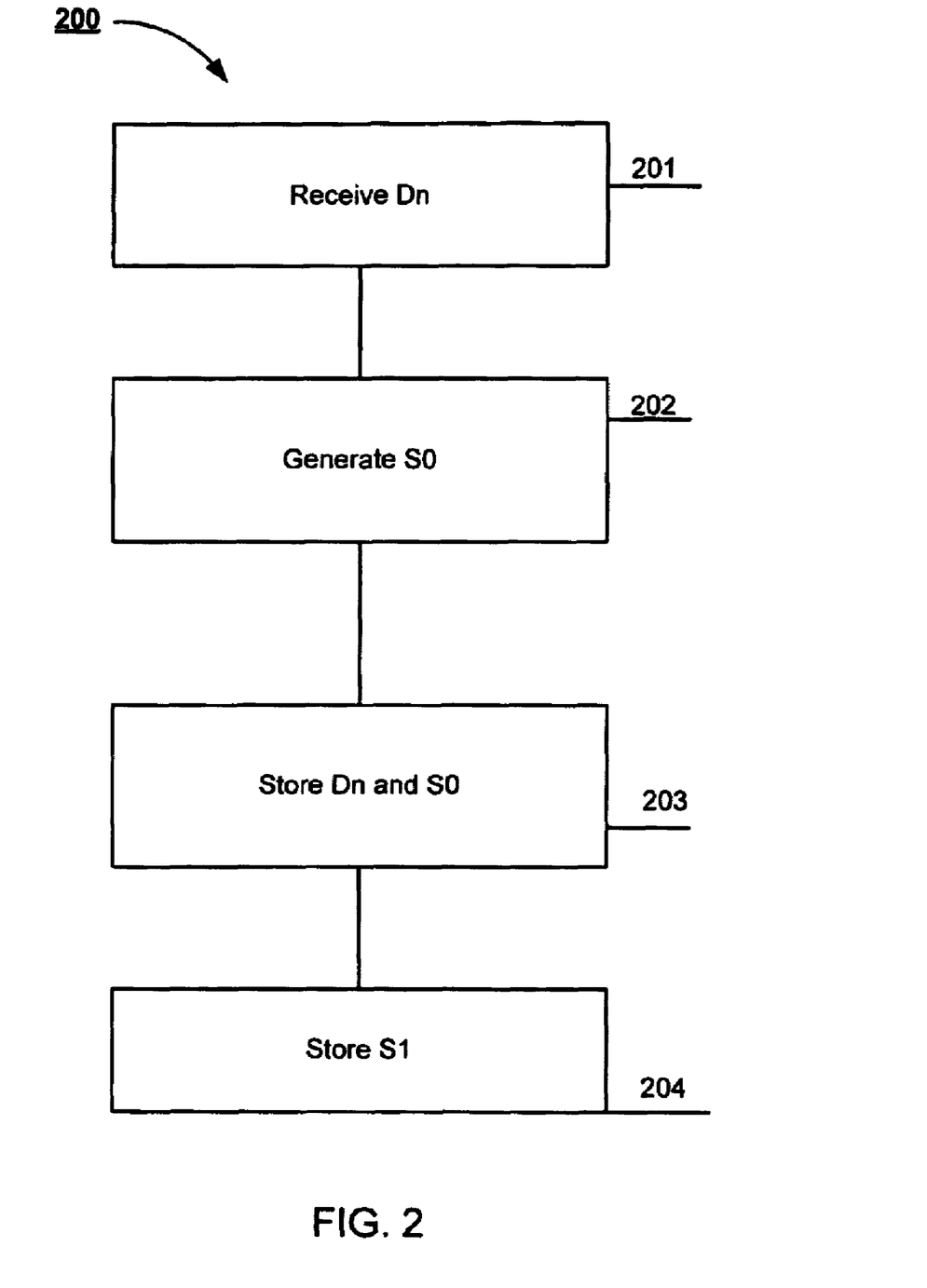
FIG. 2 is a block diagram illustrating the initial calculation and storage of the data and check values.

Method flow chart (200) of FIG. 2, shows the bit data is received at process step (201) by a processor (such as 101) and is sent to a MAC (such as 103). At process step (202), the MAC generates a first value $S_0$, determined by a relationship $$\left(S_0 = \sum_{i=0}^{n-1} X_1 * D_i\right),$$

wherein "n" comprises the positive integer corresponding to the total number of elements in the array of bit data groupings to be processed, and $D_i$ represents the $i^{th}$ element in the array of data. When each data bit grouping is a single bit, "n" comprises the positive integer corresponding to the total number of single bits in the block of data to be processed, and $D_i$ represents the $i^{th}$ single bit in the data block.

$X_i$ comprises a weighted coefficient and represents a list of numbers that do not contain certain prime factors, e.g. 2 and 3. $X_i$ is determined by the generating function [(k*i)+A], wherein "k" comprises a predetermined constant, "A" comprises a predetermined offset value, and "i" comprises an integer index value that indicates which data value is being acted upon in the array of data. The integer index value increases from 0→n−1.

One embodiment of this invention sets "k" to 6 and "A" to 7. For example, setting "k" to 6 and the offset value "A" to 7 would yield multipliers of 7, 13, 19, 25, . . . , [6*(n−1)+7]. Therefore, each weighted coefficient generated by the generating function is multiplied by the selected data, i.e., either the $i^{th}$ element in the array of data, or the $i^{th}$ single bit in the data block.

In another embodiment of this invention, where the bit grouping is a single bit; n is the number of bits in D, k=1, and A≧n, each bit is processed one at a time as the sum $S_0$ is accumulated. If one of the bits in D changes from 0 to 1 then $S_0$ will increase by A to (A+n−1) depending on which bit changes. If one of the bits in D changes from 1 to 0 then $S_0$ will decrease by (−A−n+1) to −A. If two bits in D change from 0 to 1 then $S_0$ will change from (2A+1) to (2A+2n−3). If two bits in D change from 1 to 0 then $S_0$ will change from (−2A−2n+3) to (−2A−1). If two bits in D change, one bit going from 1 to 0 and the other going from 0 to 1 then, the change in $S_0$ from (−n+1) to (n−1). It should be noted the change in $S_0$ can not be 0 for a 2 bit change. In addition if A≧n then these ranges do not over lap! Hence, it is possible to tell the difference between a one and two bit change just by the size of the change in $S_0$.

The sum of these operations, i.e.

$$\left(S_0 = \sum_{i=0}^{n-1} X_1 * D_i\right),$$

is taken and constitutes, $S_0$, which at process step (203), is stored with the bit data groupings, $D_n$, in a memory (such as 102), and at process step (204), a copy of $S_0$, is also stored in the memory as $S_1$.

Figure 3:
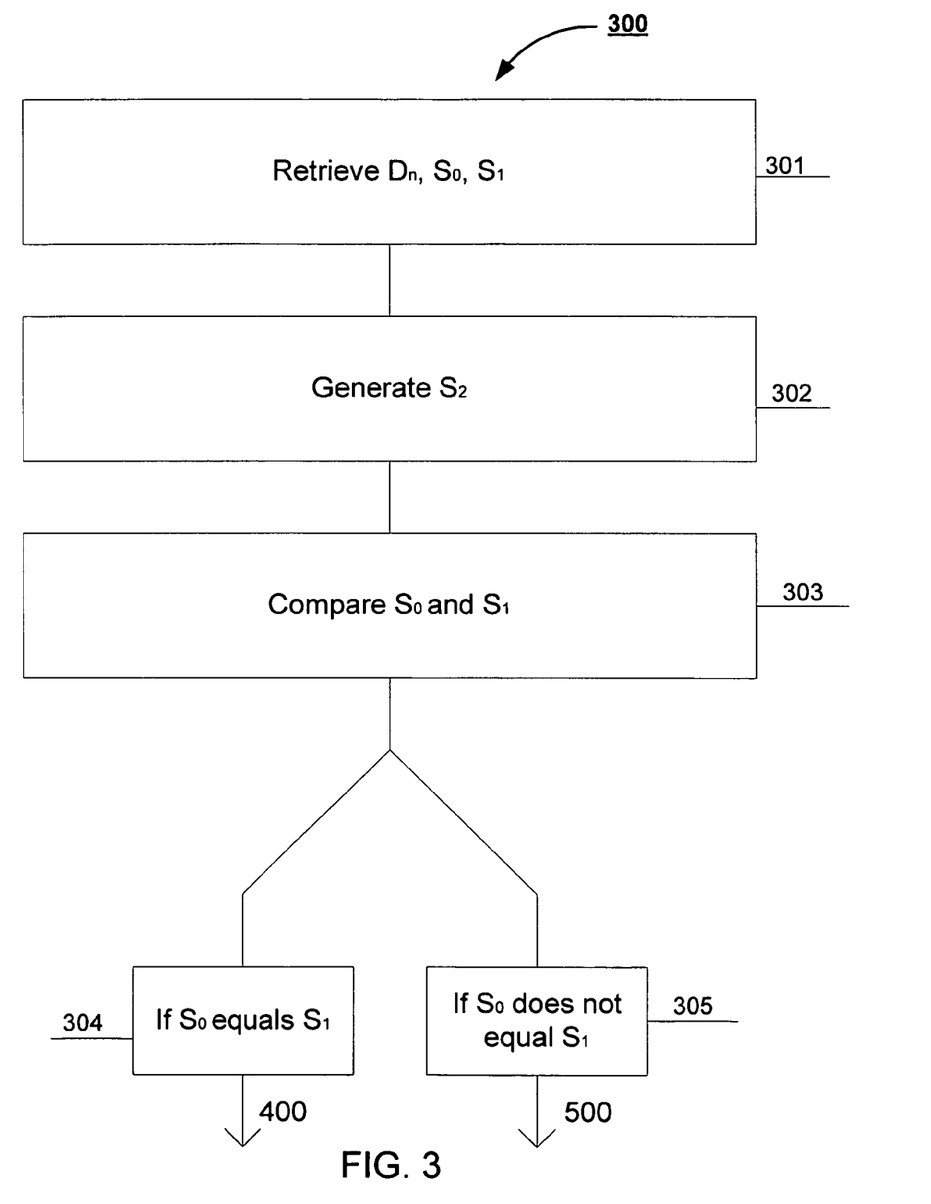
FIG. 3 is a block diagram illustrating the receiving of the stored data symbols, the generation of $S_2$, and the determination of whether received $S_0$ and $S_1$ are equivalent.

As shown by process (300) of FIG. 3, after storage of $D_n$, $S_0$, and $S_1$ into a storage device (such as 102), a processor (such as 101) retrieves $D_n$, $S_0$, and $S_1$ from a memory (such as 102) at process step (301). Hereafter, received $D_n$, $S_0$, and $S_1$ will be designated $D_n'$, $S_0'$, and $S_1'$ for clarity. $D_n'$ is processed by a MAC (such as 103) to generate a check value $S_2$, as shown by process step (302), which is determined by a relationship $$\left(S_2 = \sum_{i=0}^{n-1} X_1 * D_i\right),$$

wherein "n" comprises the positive integer corresponding to the total number of elements in the array number of bit data groupings to be processed and $D_i$ represents the $i^{th}$ element in the array of data. Again, $X_i$ is determined by the generating function [(k*i)+A], wherein "k" comprises a predetermined constant, "A" comprises a predetermined offset value, and "i" comprises an integer index value that indicates which data grouping is being acted upon in the array of data. The integer index value increases from 0→n−1.

Continuing with process step (303), once $S_2$ has been generated, retrieved $S_0'$ and $S_1'$ are compared. At process step (304), if there is no difference between the retrieved $S_0'$ and $S_1'$ values, the process continues to flow process (400) of FIG. 4. At process step (305), if there is a difference between the retrieved $S_0'$ and $S_1'$ values, the process continues to flow process (500) of FIG. 5.

Figure 4:
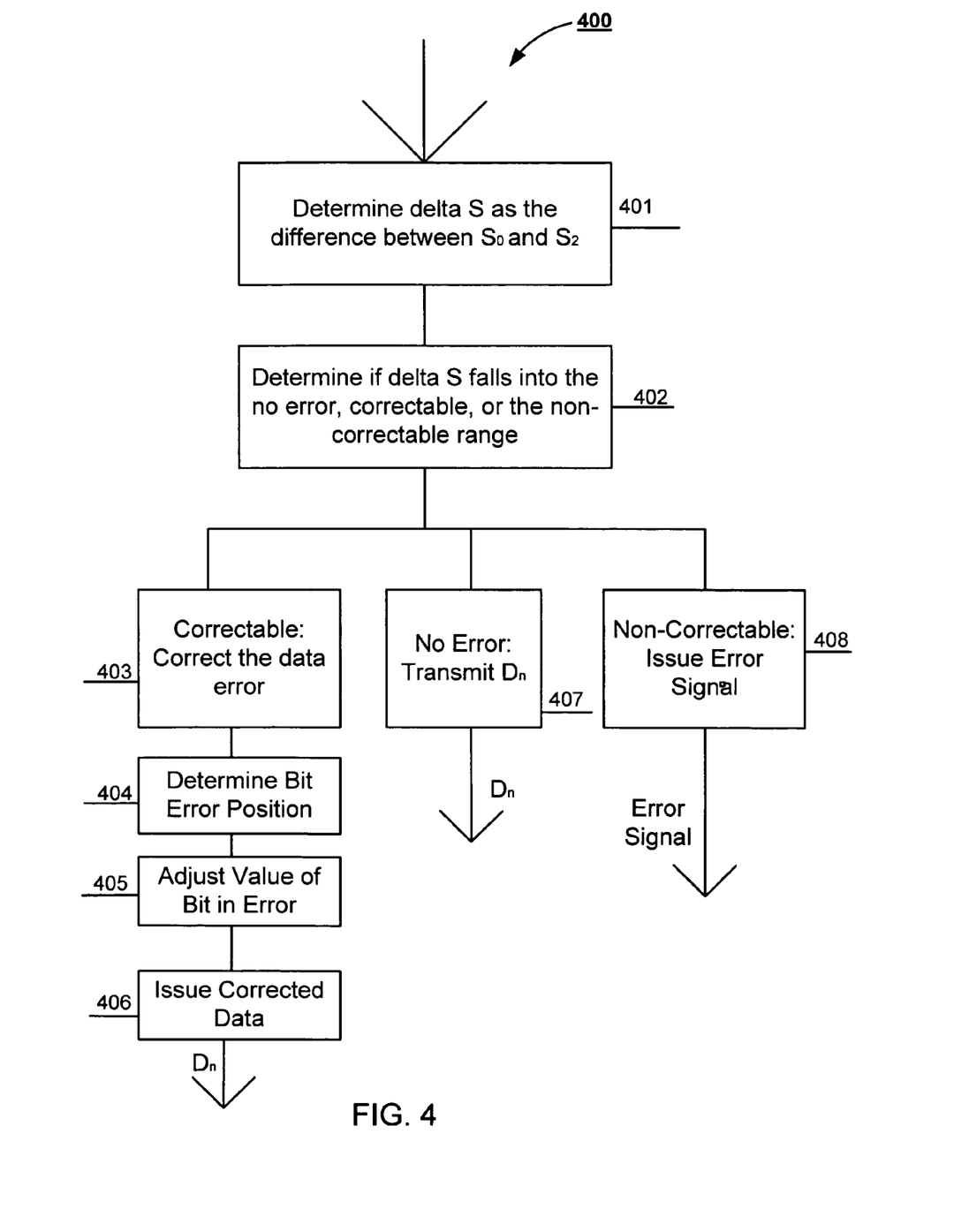
FIG. 4 is a block diagram illustrating the steps taken if $S_0$ and $S_1$ were equivalent.

At process step (401) of flow process (400) of FIG. 4, a processor (such as 101) calculates a result between $S_0'$ and $S_2$ producing a difference ΔS, given by the equation ΔS=$S_0'$−$S_2$. At Process step (402) the processor determines whether ΔS falls into a correctable or a non-correctable error range, by determining if no error occurred, a single bit error occurred, or if a multi-bit error occurred. The range of ΔS determines the number of errors that have occurred. If ΔS lies within the correctable range, i.e. a single bit error occurred, the processor begins an error correction algorithm at process step (403).

For single bit errors, the processes advances to process step (404). At process step (404), the error correction algorithm comprises; determining a bit position, B, of the data error by a relationship $$B = \frac{(|\Delta S| - A)}{k},$$

in other words (for single bit errors), solving for B yields the position of the bit in error. The values of "A" and "k" are identical to those used in the calculation of $X_i$ above, and accordingly, all of the rightmost zeros of ΔS have been discarded by the processor. The process of discarding the zeros identifies the bit position that is in error, while the remaining value determines which byte the bit is located in. Thus, this formula gives the bit location of the bit in error. However, if the bit grouping is a single bit, it is noted that the step of discarding the rightmost zeros of ΔS is not necessary, because there no rightmost zeros to discard. It is also noted that if B is not an integer, the error is not a single bit error, and process step (405) can not be relied on to reliably correct the error.

At process step (405), this bit location is "flipped," that is, the bit value of the bit in position B is increased when ΔS has a negative value, i.e. 0→1 (405). Likewise, the bit value of the bit in position B is decreased when ΔS has a positive value, i.e. 1→0. In this manner, a single bit error is corrected. After the bit correction, the data, $D_n$, is transmitted from the processor at process step (406).

If however, at process step (402), ΔS is equal to zero then no error occurred and the data, $D_n$, is transmitted from the processor at process step (407). If at process step (402), ΔS lies within a non-correctable error range, then a multi-bit error occurred and the processor issues a non-correctable error signal at process step (408).

Figure 5:
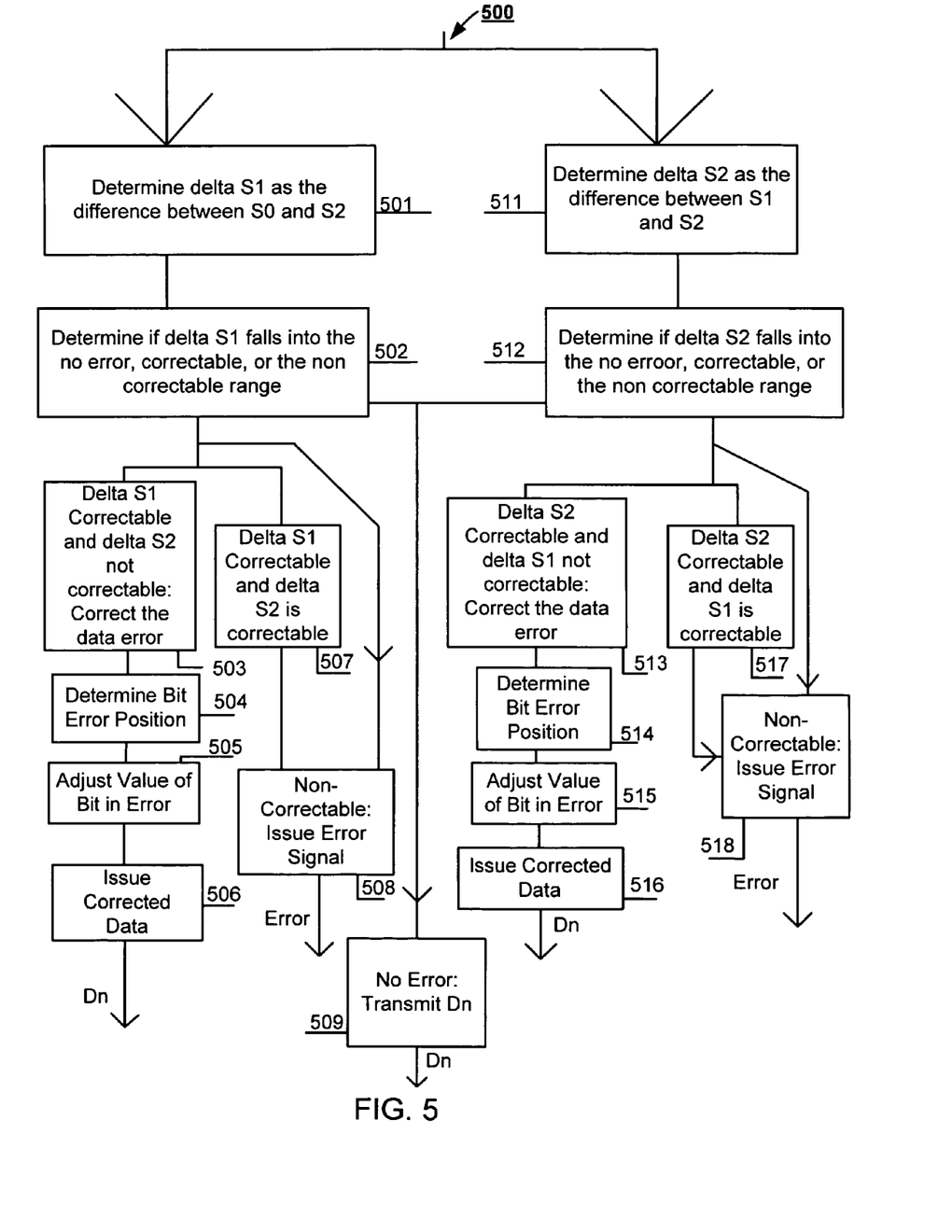
FIG. 5 is a block diagram illustrating the steps taken if $S_0$ and $S_1$ were determined to not be equivalent.

Returning to FIG. 3, at process step (305) once $S_2$ has been generated and retrieved $S_0'$ and $S_1'$ have been compared, if there exists a difference between $S_0'$ and $S_1'$ when the received values are compared, the process proceeds to process step (501) of flow process (500) of FIG. 5. At process step (501) a processor (such as 101) generates a $\Delta S_1$, and at process step (511) the processor generates a $\Delta S_2$, wherein $\Delta S_1 = S_0' - S_2$, and $\Delta S_2 = S_1' - S_2$.

At process steps (502 and 512), the processor determines whether the respective ΔS values ($\Delta S_1$ and $\Delta S_2$) fall into a correctable or a non-correctable error range, by determining if no error occurred, a single bit error occurred, or if a multi-bit error occurred. The ranges of the respective ΔS values determine the number of errors that have occurred. If $\Delta S_1$ or $\Delta S_2$ is equal to zero then no error occurred the data, $D_n$, is transmitted from the processor at process step (509).

At process steps (508 and 518), if $\Delta S_1$ and $\Delta S_2$ both fall into a non-correctable error range, or both fall into a correctable range, then a multi-bit error occurred and the processor issues a non-correctable error signal. If, however, $\Delta S_1$ falls into a correctable error range and $\Delta S_2$ falls into a non-correctable range, or if $\Delta S_2$ falls into a correctable error range and $\Delta S_1$ falls into a non-correctable range, a single bit error occurred and the processor begins an error correction algorithm at process step (503).

For the case where $\Delta S_1$ falls into a correctable error range and $\Delta S_2$ falls into a non-correctable range, at process step (504) a error correction algorithm commences by determining a bit position, B, of the data error by a relationship $$B = \frac{(|\Delta S_1| - A)}{k}.$$

The values of "A" and "k" are identical to those used in the calculation of $X_i$ above, and for this embodiment, ΔS, has had all its rightmost zeros discarded by the processor. The process of discarding the zeros identifies the bit position that is in error, while the remaining value determines which byte the bit is located in. Thus, this relationship, $$B = \frac{(|\Delta S_1| - A)}{k}$$

gives the bit location of the bit in error. However, if the bit grouping is a single bit, it is noted that the step of discarding the rightmost zeros of ΔS is not necessary, because there no rightmost zeros to discard.

At process step (505), the bit location determined at process step (504) is "flipped", that is, the bit value of the bit in position B is increased when $\Delta S_1$ has a negative value, i.e. 0→1, or the bit value of the bit in position B is decreased when $\Delta S_1$ has a positive value, i.e. 1→0 at process step (505). In this manner, a single bit error is corrected. After the bit correction, the data, $D_n$, is transmitted from the processor at process step (506).

At process step (513) $\Delta S_1$ and $\Delta S_2$ are analyzed to determine whether or not $\Delta S_2$ falls into a correctable error range and $\Delta S_1$ falls into a non-correctable range. If $\Delta S_2$ falls into a correctable error range and $\Delta S_1$ falls into a non-correctable range, the process continues with process step (514) with determining a bit position, B, of the data error, through use of an error correction algorithm in the form of a relationship $$B = \frac{(|\Delta S_2| - A)}{k}.$$

In a preferred embodiment, the values of "A" and "k" are identical to those used in the calculation of $X_i$ above, and all the rightmost zeros of $\Delta S_2$ have been discarded by the processor.

The process of discarding the zeros identifies the bit position that is in error, while the remaining value determines which byte the bit is located in. Thus, this formula gives the bit location of the bit in error. At process step (515), the bit location determined at process step (214) is "flipped" at process step (516), that is, the bit value of the bit in position B is increased when $\Delta S_2$ has a negative value, i.e. 0→1, or the bit value of the bit in position B is decreased when $\Delta S_1$ has a positive value, i.e. 1→0. In this manner, a single bit error is corrected. After the bit correction, the data, $D_n$, is transmitted from the processor at process step (517).

A second embodiment of the invention makes use of lookup tables for accelerated generation of the data verification value, $S_0$. It generates the same $S_0$ as the single bit grouping described above, with the advantage of processing the data in groups (bytes) instead of a bit at a time. One embodiment of the method is applicable to a flash memory. The flash memory embodiment will be discussed below with regard to the method of error detection and correction described below.

This embodiment for a method for error detection and correction of a memory (such as 102) of a storage circuit (such as 100), commences at process step (201) of flow process (200) of FIG. 2 and includes receiving a series of bit data groupings, $D_n$, into a memory processor unit (such as 100). The data bit groupings, $D_n$, are an array of data, typically grouped into bytes, however, the data groups can be of any size, including a single bit. The memory processor unit includes a multiply accumulator circuit (MAC) (such as 103), a processor (such as 101), and cache storage (such as 104). The bit data groupings are processed by the MAC. At process step (202), the MAC generates a first value $S_0$, determined by a relationship $$\left(S_0 = \sum_{i=0}^{n-1} C_i * Wt(B_i) + G(B_i)\right),$$

relationship wherein "n" comprises the total number of bit data groupings to be processed, "i" comprises an integer index value that corresponds with which data grouping is being acted upon in the data grouping array, $Wt(B_i)$ represents the weight of the data grouping currently being acted upon, $G(B_i)$ represents the sum of the bit positions, and "$C_i$" comprises a calculated offset value. "$C_i$" is initially set to a predetermined offset value "A." Subsequently, $C_i$ is increased through each iteration of $S_0$ calculation, by the generating function ($C_i = C_i + k*m$), where "m" is the total number of bits in the selected data grouping. In the instant embodiment, "k", which comprises a predetermined constant just as in the prior embodiment, is set to 1. Thus, "k" disappears from the calculation of $S_0$.

$Wt(B_i)$ is selected from values stored in the first lookup table, $T_1$, and corresponds to the bit weight of the received data stream, that is, the number of bits equal to 1 in the data grouping. For example, $Wt(B_i)$ for 10101010=4, while $Wt(B_i)$ for 11111111=8. Therefore, the data grouping is examined and the weight value corresponding to the data grouping is retrieved from the first lookup table, $T_1$, and applied by the MAC into the calculation of $S_0$. The lookup table can, in one embodiment, be stored in the cache unit (104).

$G(B_i)$ is extracted from a secondary lookup table $T_2$, which can be, but is not necessarily stored in circuitry separate from $T_1$. $G(B_i)$ is determined by the relationship, $$G(B_i) = k * \sum_{j=0}^{m-1} (b_{(i,j)} * j),$$

where "j" is a positive index value, "m" is the total number of bits in the selected data grouping, and $b_{(i,j)}$ corresponds to the bit value in the bit position. For example, $G(B_i)$ for 10000001==>k*(1*7+0*6+0*5+0*4+0*3+0*2+0*1+1*0)= k*7. A second example is, $G(B_i)$ for 10000100==>k*(1*7+ 0*6+0*5+0*4+0*3+1*2+0*1+0*0)=k*9. The secondary lookup table can, in one embodiment, be stored in the cache (104).

At process step (203), the sum of the operations utilizing values stored in lookup tables for the data groupings constitutes $S_0$. $S_0$ is stored with the bit data groupings, $D_n$, in the storage circuit, and at process step (204) a copy of $S_0$, is also stored in the storage circuit as $S_1$.

Continuing with flow process (300) of FIG. 3, after storing $D_n$, $S_0$, and $S_1$ into the flash memory, the processor retrieves $D_n$, $S_0$, and $S_1$, from the memory at process step (301). $D_n$, $S_0$, and $S_1$ will hereafter be designated $D_n'$, $S_0'$, and $S_1'$ for clarity. At process step (302), $D_n'$ is processed again by the MAC to generate a check value $S_2'$ determined by a relationship $$\left(S_2 = \sum_{i=0}^{n-1} C_i * Wt(B_i) + G(B_i)\right),$$

wherein "n", "i", and "$C_i$", represent the same values as outlined above and used in the calculation of $S_0$. $Wt(B_i)$ and $G(B_i)$ are extracted using the identical method to that described above, and are used in the calculation of $S_2$ as they were used above in the calculation of $S_0$.

Once $S_2$ has been generated, retrieved $S_0'$ and $S_1'$ are compared at process step (303). At process step (304), if there is no difference between the retrieved $S_0'$ and $S_1'$ values, the process proceeds to flow process 400, of FIG. 4, and the processor calculates a result between $S_0'$ and $S_2$ producing a difference $\Delta S$ at process step (401), given by the equation $\Delta S = S_0' - S_2$. At process step (402), the processor determines whether $\Delta S$ falls into a correctable or a non-correctable error range, by determining if no error occurred, a single bit error occurred, or if a multi-bit error occurred. The range of $\Delta S$ determines the number of data errors present. If $\Delta S$ is equal to zero then no error occurred and the data, $D_n$, is transmitted from the memory processor unit at process step (407). If $\Delta S$ falls into a non-correctable error range, a multi-bit error occurred and the processor issues a non-correctable error signal at process step (408). However, if $\Delta S$ falls into the correctable range, i.e. a single bit error occurred, the coprocessor begins an error correction algorithm at process step (403).

At process step (404), a bit position, B, is preferably determined by an error correction algorithm that comprises a determination of the data error by a relationship $$B = \frac{(|\Delta S| - A)}{k}.$$

The values of "A" and "k" are identical to those used in the calculation of $S_0$ above, and since "k"=1, the equation becomes B=(|$\Delta S$|−A). $\Delta S$ has its rightmost zeros discarded by the processor. At process step (405), the process of discarding the zeros identifies the bit position that is in error, while the remaining value determines which byte the bit is located in. Thus, this formula gives the bit location of the bit in error. This bit location is then "flipped," that is, the bit value of the bit in position B is increased when $\Delta S$ has a negative value, i.e. 0→1. Likewise, the bit value of the bit in position B is decreased when $\Delta S$ has a positive value, i.e. 1→0. In this manner, a single bit error is corrected. After the bit correction, the data, $D_n$, is transmitted from the processor unit at process step (406). Again it is noted that for the case that the bit grouping is a single bit, the step of discarding the rightmost zeros of $\Delta S$ is not necessary, because there no rightmost zeros to discard.

Alternatively, once $S_2$ has been generated, and retrieved $S_0'$ and $S_1'$ have been compared at process step (303), if at process step (305) there exists a difference between $S_0'$ and $S_1'$ when the received values are compared, the process proceeds to flow process (500) of FIG. 5, and the processor generates both a $\Delta S_1$ and a $\Delta S_2$ at process steps (501 and 511) respectively, wherein $\Delta S_1 = S_0' - S_2$ and $\Delta S_2 = S_1' - S_2$. At process steps (502 and 512) respectively, the processor determines whether the $\Delta S$ values fall into a correctable or a non-correctable error range, by determining if no error occurred, a single bit error occurred, or if a multi-bit error occurred.

The ranges of $\Delta S$ determine the number of errors that have occurred. If $\Delta S_1$ or $\Delta S_2$ is equal to zero then no error occurred and the data, $D_n$, is transmitted from the processor at process step (509). At process steps (507 and 517) respectively, if $\Delta S_1$ and $\Delta S_2$ both fall into either a correctable or non-correctable error range, a multi-bit error occurred and the processor issues a non-correctable error signal at process steps (508, 518) respectively.

If, however, $\Delta S_1$ falls into a correctable error range and $\Delta S_2$ falls into a non-correctable range, or if $\Delta S_2$ falls into a correctable error range and $\Delta S_1$ falls into a non-correctable range, then a single bit error occurred and the coprocessor begins an error correction algorithm at respective process steps (503 and 513).

For the case where $\Delta S_1$ falls into a correctable error range and $\Delta S_2$ falls into a non-correctable range, at process step (504) the error correction algorithm consists of determining a bit position, B, of the data error by a relationship $$B = \frac{(|\Delta S_1| - A)}{k}.$$

The values of "A" and "k" are identical to those used in the calculation of $S_0$ above, and so the equation becomes $B=(|\Delta S_1|-A)$. At process step (505), $\Delta S_1$ has its rightmost zeros discarded by the coprocessor. The process of discarding the zeros identifies the bit position that is in error, while the remaining value determines which byte the bit is located in. Thus, this formula gives the bit location of the bit in error. This bit location is then flipped, that is, the bit value of the bit in position B is increased when $\Delta S_1$ has a negative value, i.e. 0→1. Likewise, the bit value of the bit in position B is decreased when $\Delta S_1$ has a positive value, i.e. 1→0. In this manner, a single bit error is corrected, and after the bit correction, the data, $D_n$, is transmitted from the memory by the processor at process step (506).

For the case where $\Delta S_2$ falls into a correctable error range and $\Delta S_1$ falls into a non-correctable range, at process step (514), the error correction algorithm consists of determining a bit position, B, of the data error by a relationship $$B = \frac{(|\Delta S_2| - A)}{k}.$$

The values of "A" and "k" are identical to those used in the calculation of $S_0$ above, so the equation becomes $B=(|\Delta S_2|-A)$. At process step (515), $\Delta S_2$ has its rightmost zeros discarded by the coprocessor. The process of discarding the zeros identifies the bit position that is in error, while the remaining value determines which byte the bit is located in. Thus, this formula gives the bit location of the bit in error. This bit location is "flipped", that is, the bit value of the bit in position B is increased when $\Delta S_2$ has a negative value, i.e. 0→1. Likewise, the bit value of the bit in position B is decreased when $\Delta S_2$ has a positive value, i.e. 1→0. In this manner, a single bit error is corrected, and after the bit correction, the data, $D_n$, is transmitted from the memory by the processor at process step (516).

As will be apparent to those skilled in the art, a number of modifications could be made to the preferred embodiments which would not depart from the spirit or the scope of the present invention. While the presently preferred embodiments have been described for purposes of this disclosure, numerous changes and modifications will be apparent to those skilled in the art. In particular, it is recognized that the error detection and correction methodologies disclosed herein may be implemented, with equal effectiveness, in either hardware or software implementations. Accordingly, such changes, modifications, or selected implementations are encompassed within the spirit of this invention.

What is claimed is:

1. A method comprising:
   receiving a series of bit data groupings, $D_n$;
   generating a first value $S_0$, determined by a relationship $$\left(S_0 = \sum_{i=0}^{n-1} X_1 * D_i\right),$$

wherein n comprises a total number of bit data groupings, $D_i$ comprises each bit data grouping of the bit data groupings $D_n$, and $X_i$ comprises a weighted coefficient; and
storing the bit data groupings, $D_n$, and the first value, $S_0$.

2. The method of claim 1, in which said weighted coefficient, $X_i$, is determined by [(k*i)+A], wherein "k" comprises a predetermined constant, "i" comprises an integer index value increasing from 0→n−1, and in which "A" comprises a predetermined offset value.

3. The method of claim 2, further comprising, storing a copy of the first value, $S_0$, as a second value, $S_1$.

4. The method of claim 3, further comprising:
   retrieving each of $D_n$, $S_0$, and $S_1$;
   generating a third value, $S_2$, determined by a relationship $$\left(S_2 = \sum_{i=0}^{n-1} X_i * D_i\right),$$

wherein n comprises a total number of bit data groupings, $D_i$ comprises each bit data grouping of the bit data groupings $D_n$, and $X_i$ comprises a weighted coefficient; and
   comparing $S_2$ with $S_0$ and $S_1$ to determine an error occurrence.

5. The method of claim 4, in which determining an error occurrence comprises:
   determining a difference between $S_0$ and $S_1$;
   producing a difference, $\Delta S=S_0-S_2$, when no difference between $S_0$ and $S_1$ is determined; else
   generating both a $\Delta S_1=S_0-S_2$ and a $\Delta S_2=S_1-S_2$.

6. The method of claim 5, further comprising:
   determining whether $\Delta S$ falls into a correctable or a non-correctable error range;
   correcting a data error when $\Delta S$ falls into the correctable range; else
   issuing a non-correctable error signal when $\Delta S$ falls into a non-correctable error range.

7. The method of claim 6, in which correcting the data error comprises:
   determining a bit position, B, of the data error by a relationship B=

$$\frac{(|\Delta S| - A)}{k};$$

increasing a bit value of the bit of position B when ΔS has a negative value and
issuing the corrected data, $D_n$; else
decreasing a bit value of the bit of position B when ΔS has a positive value and
issuing the corrected data, $D_n$.

8. The method of claim 5, further comprising:
correcting a data error utilizing $\Delta S_1$, when $\Delta S_1$ falls into a correctable error range and when $\Delta S_2$ falls into a non-correctable range;
correcting a data error utilizing $\Delta S_2$, when $\Delta S_2$ falls into a correctable error range and when $\Delta S_1$ falls into a non-correctable range; else
issuing a non-correctable error signal.

9. The method of claim 7, in which correcting the data error utilizing $\Delta S_1$, when $\Delta S_1$ falls into a correctable error range and when $\Delta S_2$ falls into a non-correctable range comprises:
determining a bit position, B, of the data error by a relationship B=

$$\frac{(|\Delta S_1| - A)}{k};$$

increasing a bit value of the bit of position B when $\Delta S_1$ has a negative value and
issuing the corrected data, $D_n$; else
decreasing a bit value of the bit of position B when $\Delta S_1$ has a positive value and
issuing the corrected data, $D_n$.

10. The method of claim 8, in which correcting the data error utilizing $\Delta S_2$, when $\Delta S_2$ falls into a correctable error range and when $\Delta S_1$ falls into a non-correctable range comprises:
determining a bit position, B, of the data error by a relationship B=

$$\frac{(|\Delta S_2| - A)}{k};$$

increasing a bit value of the bit of position B when $\Delta S_2$ has a negative value and
issuing the corrected data, $D_n$; else
decreasing a bit value of the bit of position B when $\Delta S_2$ has a positive value; and
issuing the corrected data, $D_n$.

11. A device comprising:
a circuit configured to receive a series of bit data groupings, $D_n$;
a multiply accumulator configured to generate a first value $S_0$, determined by a relationship $$\left(S_0 = \sum_{i=0}^{n-1} X_i * D_i\right),$$

wherein n comprises a total number of bit data groupings, $D_i$ comprises each bit data grouping of the bit data groupings $D_n$, and $X_i$ comprises a weighted coefficient; and
a storage circuit configured to store the bit data groupings, $D_n$, and the first value, $S_0$.

12. The device of claim 11, wherein said weighted coefficient, $X_i$, is determined by [(k*i)+A], wherein "k" comprises a predetermined constant, "i" comprises an integer index value increasing from 0→n−1, and in which "A" comprises a predetermined offset value.

13. The device claim 12, wherein the storage circuit is further configured to store a copy of the first value, $S_0$, as a second value, $S_1$.

14. The device of claim 13, further comprising:
circuitry configured to retrieve each of $D_n$, $S_0$, and $S_1$;
the multiply accumulator configured to generate a third value, $S_2$, determined by a relationship $$\left(S_2 = \sum_{i=0}^{n-1} X_i * D_i\right),$$

wherein n comprises a total number of bit data groupings, $D_i$ comprises each bit data grouping of the bit data groupings $D_n$, and $X_i$ comprises a weighted coefficient; and
comparison circuitry for comparing $S_2$ with $S_0$ and $S_1$ to determine an error occurrence.

15. The device of claim 14, in which determining an error occurrence comprises:
circuitry configured to determine a difference between $S_0$ and $S_1$;
circuitry configured to produce a difference, $\Delta S = S_0 - S_2$, when no difference between $S_0$ and $S_1$ is determined;
circuitry configured to generate both a $\Delta S_1 = S_0 - S_2$ and a $\Delta S_2 = S_1 - S_2$, when no difference between $S_0$ and $S_1$ is determined.

16. The device of claim 15, further comprising:
circuitry configured to determine whether ΔS falls into a correctable or a non-correctable error range;
circuitry configured to correct a data error when ΔS falls into the correctable range;
circuitry configured to issue a non-correctable error signal when ΔS falls into a non-correctable error range.

17. The device of claim 16, in which correcting the data error comprises:
circuitry configured to determine a bit position, B, of the data error by a relationship $$B = \frac{(|\Delta S| - A)}{k};$$

circuitry configured to increase a bit value of the bit of position B when ΔS has a negative value;
else circuitry configured to decrease a bit value of the bit of position B when ΔS has a positive value; and
circuitry configured to issue the corrected data, $D_n$.

18. The device of claim 15, further comprising:
circuitry configured to correct a data error utilizing $\Delta S_1$, when $\Delta S_1$ falls into a correctable error range and when $\Delta S_2$ falls into a non-correctable range;
circuitry configured to correct a data error utilizing $\Delta S_2$, when $\Delta S_2$ falls into a correctable error range and when $\Delta S_1$ falls into a non-correctable range; and circuitry configured to issue a non-correctable error signal otherwise.

19. The device of claim 18, in which correcting the data error utilizing $\Delta S_1$ when $\Delta S_1$ falls into a correctable error range and when $\Delta S_2$ falls into a non-correctable range comprises:
circuitry configured to determine a bit position, B, of the data error by a relationship $$B = \frac{(|\Delta S_1| - A)}{k};$$

circuitry configured to increase a bit value of the bit of position B when $\Delta S_1$ has a negative value;
else circuitry configured to decrease a bit value of the bit of position B when $\Delta S_1$ has a positive value; and
circuitry to issue the corrected data, $D_n$.

20. The device of claim 18, in which correcting the data error utilizing $\Delta S_2$, when $\Delta S_2$ falls into a correctable error range and when $\Delta S_1$ falls into a non-correctable range comprises:
circuitry configured to determine a bit position, B, of the data error by a relationship $$B = \frac{(|\Delta S_2| - A)}{k};$$

circuitry configured to increase a bit value of the bit of position B when $\Delta S_2$ has a negative value;
else circuitry configured to decrease a bit value of the bit of position B when $\Delta S_2$ has a positive value; and
circuitry to issue the corrected data, $D_n$.

21. A method comprising:
receiving a series of bit data groupings, $D_n$;
generating a first value $S_0$, determined by a relationship $$\left( S_0 = \sum_{i=0}^{n-1} C_i * Wt(B_i) + G(B_i) \right),$$

wherein "n" comprises a total number of bit data groupings, "i" comprises an integer index value increasing from $0 \rightarrow n-1$, $Wt(B_i)$ represents the weight of the data being acted upon, $G(B_i)$ represents the sum of the bit positions, and "$C_i$" comprises an offset value; and
storing the bit data groupings, $D_n$, and the first value, $S_0$.

22. The method of claim 21, in which "$C_i$" is initially set to a predetermined offset value "A", and subsequently, $C_i$ is increased through each iteration of $S_0$ calculation, by the generating function ($C_i = C_i + k*m$), where "m" is the total number of bits in the selected data grouping, where $Wt(B_i)$ is selected from values stored in a lookup table and corresponds to the bit weight of the received data stream, and $G(B_i)$ is determined by the relationship, $$G(B_i) = k * \sum_{j=0}^{m-1} (b_{(i,j)} * j),$$

where "j" is a positive index value, "m" is the total number of bits in the selected data grouping, and $b_{(i,j)}$ corresponds to the bit value in the bit position.

23. The method of claim 22, further comprising, storing a copy of the first value, $S_0$, as a second value, $S_1$.

24. The method of claim 23, further comprising:
retrieving each of $D_n$, $S_0$, and $S_1$;
generating a third value, $S_2$, determined by a relationship $$\left( S_2 = \sum_{i=0}^{n-1} C_i * Wt(B_i) + G(B_i) \right);$$

and
comparing $S_2$ with $S_0$ and $S_1$ to determine an error occurrence.

25. The method of claim 24, in which determining an error occurrence comprises:
determining a difference between $S_0$ and $S_1$;
producing a difference, $\Delta S = S_0 - S_2$, when no difference between $S_0$ and $S_1$ is determined; else
generating both a $\Delta S_1 = S_0 - S_2$ and a $\Delta S_2 = S_1 - S_2$.

26. The method of claim 25, further comprising:
determining whether $\Delta S$ falls into a correctable or a non-correctable error range;
correcting a data error when $\Delta S$ falls into the correctable range; else
issuing a non-correctable error signal when $\Delta S$ falls into a non-correctable error range.

27. The method of claim 26, in which correcting the data error comprises:
determining a bit position, B, of the data error by a relationship, $B = (|\Delta S| - A)$;
increasing a bit value of the bit of position B when $\Delta S$ has a negative value and
issuing the corrected data, $D_n$;
else decreasing a bit value of the bit of position B when $\Delta S$ has a positive value and issuing the corrected data, $D_n$.

28. The method of claim 25, further comprising:
correcting a data error utilizing $\Delta S_1$, when $\Delta S_1$ falls into a correctable error range and when $\Delta S_2$ falls into a non-correctable range;
correcting a data error utilizing $\Delta S_2$, when $\Delta S_2$ falls into a correctable error range and when $\Delta S_1$ falls into a non-correctable range; else
issuing a non-correctable error signal.

29. The method of claim 28, in which correcting the data error utilizing $\Delta S_1$, when $\Delta S_1$ falls into a correctable error range and when $\Delta S_2$ falls into a non-correctable range comprises:
determining a bit position, B, of the data error by a relationship $B = (|\Delta S_1| - A)$;
increasing a bit value of the bit of position B when $\Delta S_1$ has a negative value and
issuing the corrected data, $D_n$;
else decreasing a bit value of the bit of position B when $\Delta S_1$ has a positive value; and issuing the corrected data, $D_n$.

30. The method of claim 28, in which correcting the data error utilizing $\Delta S_2$, when $\Delta S_2$ falls into a correctable error range and when $\Delta S_1$ falls into a non-correctable range comprises:
determining a bit position, B, of the data error by a relationship $B = (|\Delta S_2| - A)$;

increasing a bit value of the bit of position B when $\Delta S_2$ has a negative value and issuing the corrected data, $D_n$;

else decreasing a bit value of the bit of position B when $\Delta S_2$ has a positive value and issuing the corrected data, $D_n$.

31. A device comprising:

a circuit configured to receive a series of bit data groupings, $D_n$;

a multiply accumulator configured to generate a first value $S_0$, determined by a relationship $$\left(S_0 = \sum_{i=0}^{n-1} C_i * Wt(B_i) + G(B_i)\right),$$

wherein n comprises a total number of bit data groupings, "i" comprises an integer index value increasing from $0 \rightarrow n-1$, $Wt(B_i)$ represents the weight of the data being acted upon, $G(B_i)$ represents the sum of the bit positions, and "$C_i$" comprises an offset value; and a storage circuit configured to store the bit data groupings, $D_n$, and the first value, $S_0$.

32. The device of claim 31, wherein "$C_i$" is initially set to a predetermined offset value "A", and subsequently, $C_i$ is increased through each iteration of $S_0$ calculation, by the generating function ($C_i = C_i + k*m$), where "m" is the total number of bits in the selected data grouping, where $Wt(B_i)$ is selected from values stored in a lookup table and corresponds to the bit weight of the received data stream, and $G(B_i)$ is determined by the relationship, $$G(B_i) = k * \sum_{j=0}^{m-1} (b_{(i,j)} * j),$$

where "j" is a positive index value, "m" is the total number of bits in the selected data grouping, and $b_{(i,j)}$ corresponds to the bit value in the bit position of said weighted coefficient, $X_i$, is determined by $[(k*i)+A]$, wherein "k" comprises a predetermined constant, "i" comprises an integer index value increasing from $0 \rightarrow n-1$, and in which "A" comprises a predetermined offset value.

33. The device claim 32, wherein the storage circuit is further configured to store a copy of the first value, $S_0$, as a second value, $S_1$.

34. The device of claim 33, further comprising:

circuitry configured to retrieve each of $D_n$, $S_0$, and $S_1$;

the multiply accumulator configured to generate a third value, $S_2$, determined by a relationship $$\left(S_2 = \sum_{i=0}^{n-1} C_i * Wt(B_i) + G(B_i)\right);$$

and comparison circuitry for comparing $S_2$ with $S_0$ and $S_1$ to determine an error occurrence.

35. The device of claim 34, in which determining an error occurrence comprises:

circuitry configured to determine a difference between $S_0$ and $S_1$;

circuitry configured to produce a difference, $\Delta S = S_0 - S_2$, when no difference between $S_0$ and $S_1$ is determined;

circuitry configured to generate both a $\Delta S_1 = S_0 - S_2$ and a $\Delta S_2 = S_1 S_2$, when no difference between $S_0$ and $S_1$ is determined.

36. The device of claim 35, further comprising:

circuitry configured to determine whether $\Delta S$ falls into a correctable or a non-correctable error range;

circuitry configured to correct a data error when $\Delta S$ falls into the correctable range;

circuitry configured to issue a non-correctable error signal when $\Delta S$ falls into a non-correctable error range.

37. The device of claim 36, in which correcting the data error comprises:

circuitry configured to determine a bit position, B, of the data error by a relationship $B = (|\Delta S| - A)$;

circuitry configured to increase a bit value of the bit of position B when $\Delta S$ has a negative value;

else circuitry configured to decrease a bit value of the bit of position B when $\Delta S$ has a positive value otherwise; and circuitry configured to issue the corrected data, $D_n$.

38. The device of claim 35, further comprising:

circuitry configured to correct a data error utilizing $\Delta S_1$, when $\Delta S_1$ falls into a correctable error range and when $\Delta S_2$ falls into a non-correctable range;

circuitry configured to correct a data error utilizing $\Delta S_2$, when $\Delta S_2$ falls into a correctable error range and when $\Delta S_1$ falls into a non-correctable range; and circuitry configured to issue a non-correctable error signal otherwise.

39. The device of claim 38, in which correcting the data error utilizing $\Delta S_1$, when $\Delta S_1$ falls into a correctable error range and when $\Delta S_2$ falls into a non-correctable range comprises:

circuitry configured to determine a bit position, B, of the data error by a relationship $B = (|\Delta S_1| - A)$;

circuitry configured to increase a bit value of the bit of position B when $\Delta S_1$ has a negative value;

else circuitry configured to decrease a bit value of the bit of position B when $\Delta S_1$ has a positive value; and circuitry configured to issue the corrected data, $D_n$.

40. The device of claim 38, in which correcting the data error utilizing $\Delta S_2$, when $\Delta S_2$ falls into a correctable error range and when $\Delta S_1$ falls into a non-correctable range comprises:

circuitry configured to determine a bit position, B, of the data error by a relationship $B = (|\Delta S_2| - A)$;

circuitry configured to increase a bit value of the bit of position B when $\Delta S_2$ has a negative value;

else circuitry configured to decrease a bit value of the bit of position B when $\Delta S_2$ has a positive value; and circuitry configured to issue the corrected data, $D_n$.

* * * * *